(12) United States Patent
Brinati et al.

(10) Patent No.: US 8,575,286 B2
(45) Date of Patent: Nov. 5, 2013

(54) VINYLIDENE FLUORIDE AND TRIFLUOROETHYLENE CONTAINING POLYMERS

(75) Inventors: Giulio Brinati, Milan (IT); Alessio Marrani, Lecco (IT); Bernard Goffaux, Les Bons Villers (BE)

(73) Assignee: Solvay Solexis S.p.A., Bollate (IT)

( * ) Notice: Subject to any disclaimer, the term of this patent is extended or adjusted under 35 U.S.C. 154(b) by 110 days.

(21) Appl. No.: 12/995,214

(22) PCT Filed: May 26, 2009

(86) PCT No.: PCT/EP2009/056384
§ 371 (c)(1),
(2), (4) Date: Dec. 17, 2010

(87) PCT Pub. No.: WO2009/147030
PCT Pub. Date: Dec. 10, 2009

(65) Prior Publication Data
US 2011/0082271 A1    Apr. 7, 2011

(30) Foreign Application Priority Data
Jun. 2, 2008  (EP) ..................................... 08157421

(51) Int. Cl.
*C08F 114/22*  (2006.01)
(52) U.S. Cl.
USPC ............ 526/209; 526/231; 526/249; 526/255
(58) Field of Classification Search
USPC .................................. 526/209, 255, 249, 231
See application file for complete search history.

(56) References Cited

U.S. PATENT DOCUMENTS

| 4,173,033 A | 10/1979 | Sako et al. |
| 4,569,978 A | 2/1986 | Barber |
| 4,611,260 A | 9/1986 | Bauer |
| 4,684,337 A | 8/1987 | Bauer |
| 4,708,989 A | 11/1987 | Broussoux et al. |
| 4,778,867 A * | 10/1988 | Pries .............................. 526/255 |
| 4,784,915 A | 11/1988 | Sakagami et al. |
| 4,990,283 A | 2/1991 | Visca et al. |
| 5,067,679 A * | 11/1991 | Courtney ......................... 248/75 |
| 5,087,679 A * | 2/1992 | Inukai et al. ................... 526/249 |

(Continued)

FOREIGN PATENT DOCUMENTS

EP    625526 A1 * 11/1994
EP    712882 A1    5/1996

(Continued)

OTHER PUBLICATIONS

Pianca M. et al.—"End groups in fluoropolymers", Journal of Fluorine Chemistry, 1999, vol. 95, p. 71-84, Elsevier Science; 14 pgs.*

(Continued)

*Primary Examiner* — Peter D. Mulcahy
*Assistant Examiner* — Henry Hu
(74) *Attorney, Agent, or Firm* — Arent Fox LLP

(57) ABSTRACT

A polymer comprising recurring units derived from vinylidene fluoride (VDF) and trifluoroethylene (TrFE), such polymer comprising end groups of formula —$CF_2H$ and/or —$CF_2CH_3$ in an amount of at least 60 mmoles per kg of VDF recurring units [polymer (F)], a process for its manufacture and the use thereof as ferroelectric, piezoelectric, dielectric or pyroelectric material in electric/electronic devices.

11 Claims, 1 Drawing Sheet

(56) References Cited

U.S. PATENT DOCUMENTS

| | | | |
|---|---|---|---|
| 5,498,680 A * | 3/1996 | Abusleme et al. | 526/209 |
| 6,103,843 A | 8/2000 | Abusleme et al. | |
| 7,122,608 B1 | 10/2006 | Brinati et al. | |
| 2008/0081195 A1 * | 4/2008 | Chung et al. | 428/421 |

FOREIGN PATENT DOCUMENTS

| | | | |
|---|---|---|---|
| EP | 771823 A1 * | 5/1997 | |
| EP | 0771823 A1 | 5/1997 | |
| EP | 2133370 A1 * | 6/2008 | |
| EP | 2133370 A1 * | 12/2009 | |

OTHER PUBLICATIONS

Chen Q. X. et al.—"Piezoelectric copolymers and their applications", Electrical Optical Acoustic Properties of Polymers, Int. Conf., 2nd (1990), Mar. 1-Mar. 6 Publisher: The Plastics Rubber Inst., London, UK; 7 pgs.*

Giannetti E. et al.—"Polymerization of fluorinated monomers in perfluoropolyether microemulsions", La Chimica e l'Industria (Milan), 1997, vol. 79(5), p. 611-618; 8 pgs.*

ASTM D1238—"Standard Test Method for Melt Flow Rates of Thermoplastics by Extrusion Plastometer", 2004, A00246980, p. 1-13; 14 pgs.

Isner-Brom P., et al.—"Intrinsic piezoelectric characterization of PVDF copolymers : determination of elastic constants", Ferroelectrics, 1995, vol. 171, p. 271-279, Overseas Publishers Assn, Amsterdam B.V.; 9 pgs.

Bauer F., et al—"Very high pressure behavior of precisely-poled PVDF", Ferroelectrics, 1995, vol. 171, p. 95-102, Overseas Publishers Assn, Amsterdam B.V.; 8 pgs.

Zhang Q.M. et al.—"Encyclopedia of smart materials—Poly(vinylidene fluoride) (PVDF) and its copolymers", 2002, p. 807-825, John Wiley & Sons—XP002486178; 19 pgs.

Vinogradov A. et al.—"Encyclopedia of smart materials—Piezoelectricity in polymers", 2002, p. 780-792, John Wiley & Sons—XP002486179; 13 pgs.

* cited by examiner

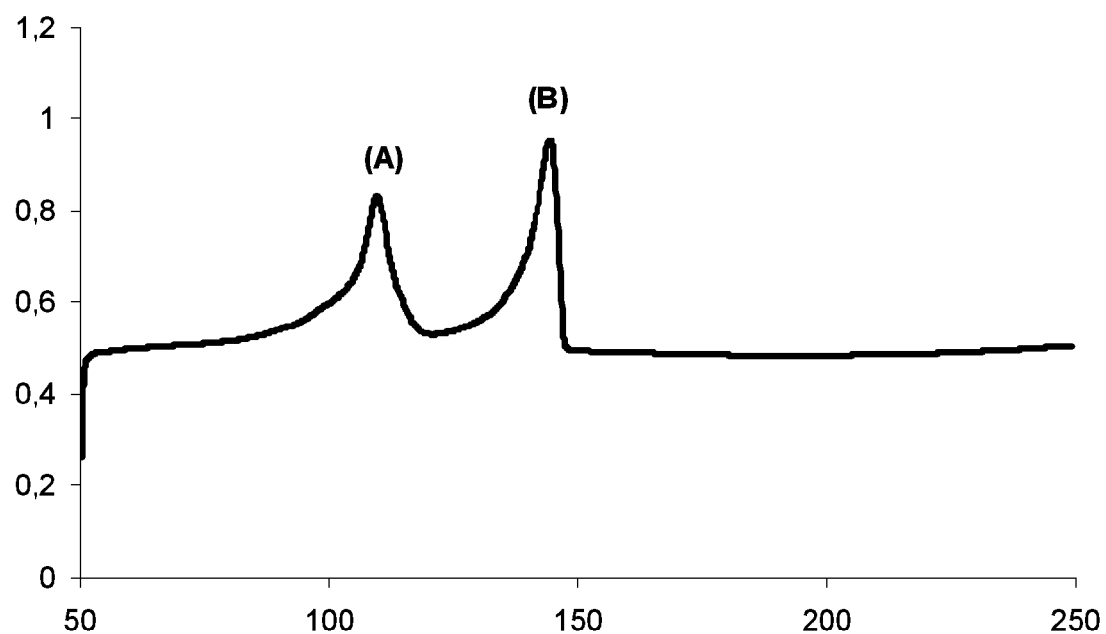

VINYLIDENE FLUORIDE AND TRIFLUOROETHYLENE CONTAINING POLYMERS

CROSS-REFERENCE TO RELATED APPLICATIONS

The present patent application is a U.S. national stage application under 35 U.S.C. §371 of International Application No. PCT/EP2009/056384, filed May 26, 2009, which claims the benefit of the European patent application No. 08157421.2, filed on Jun. 2, 2008, the whole content of this application being incorporated herein by reference for all purposes.

TECHNICAL FIELD

The invention pertains to novel copolymers of vinylidene fluoride and trifluoroethylene having improved flexibility, to a process for their manufacture and to their use as piezoelectric, ferroelectric, dielectric or pyroelectric materials in electric/electronic devices.

BACKGROUND ART

It is well known that copolymers of vinylidene fluoride and trifluoroethylene are employed and are being developed for use in electric/electronic devices (e.g. transducers, sensors, actuators, ferroelectric memories, capacitors) because of their ferroelectric, piezoelectric, pyroelectric and dielectric behaviour/properties, piezoelectric behaviour being particularly used.

As is well known, the term piezoelectric means the ability of a material to exchange electrical for mechanical energy and vice versa and the electromechanical response is believed to be essentially associated with dimensional changes during deformation or pressure oscillation. The piezoelectric effect is reversible in that materials exhibiting the direct piezoelectric effect (the production of electricity when stress is applied) also exhibit the converse piezoelectric effect (the production of stress and/or strain when an electric field is applied).

Ferroelectricity is the property of a material whereby this latter exhibits a spontaneous electric polarization, the direction of which can be switched between equivalent states by the application of an external electric field Pyroelectricity is the ability of certain materials to generate an electrical potential upon heating or cooling. Actually, as a result of this change in temperature, positive and negative charges move to opposite ends through migration (i.e. the material becomes polarized) and hence, an electrical potential is established.

It is generally understood that piezo-, pyro-, ferro-electricity in copolymers of vinylidene fluoride and trifluoroethylene is related to a particular crystalline habit, so called beta-phase, wherein hydrogen and fluorine atoms are arranged to give maximum dipole moment per unit cell.

Vinylidene fluoride (VDF) and trifluoroethylene (TrFE) copolymers are typically provided as semicrystalline copolymers which can be shaped or formed into semicrystalline, essentially unoriented and unstretched, thermoplastic film or sheet or tubular-constructed product via such well known processing methods as extrusion, injection moulding, compression moulding and solvent casting.

In addition to the good piezo-, pyro-, ferro-, and di-electric properties said copolymers have several preferable properties over ceramic materials such that they can be easily formed in thin films having a large surface area and they can be mass-produced.

Said VDF-TrFE copolymers are well known in the art and are notably described in U.S. Pat. No. 4,778,867 (PRIES SEYMOUR (US)) Oct. 18, 1988, U.S. Pat. No. 4,708,989 (THOMSON CSF (FR)) Nov. 24, 1987, U.S. Pat. No. 4,784,915 (KUREHA CHEMICAL IND CO LTD (JP)) Nov. 15, 1988, U.S. Pat. No. 4,173,033 (DAIKIN IND LTD (JP)) Oct. 30, 1979.

However, VDF-TrFE copolymers of the prior art suffer from a poor elastic behaviour; actually, in operations of piezoelectric devices, the piezoelectric materials are submitted to sequential strains and deformations: the inherent flexibility or deformability of the materials (or in other words their elastic behaviour) is thus a key parameter for ling-life operations.

On the other side, optimization of piezoelectric, pyroelectric or ferroelectric effect requires crystalline phase beta fraction, as above described, to be maximized, crystallinity being otherwise related to brittle behaviour of the material.

There is thus still a need in the art for VDF-TrFE copolymer materials, and a method for their manufacture, which can fulfil such antagonist requirements and which offer increased flexibility and deformability, while maintaining outstanding piezoelectric, ferroelectric pyroelectric, and/or dielectric properties.

The invention described herein provides a material and a method which satisfy these needs.

BRIEF DESCRIPTION OF THE DRAWING

FIG. 1 shows a DSC scan of a polymer in accordance with aspects of the present invention.

DISCLOSURE OF INVENTION

The invention thus provides a novel polymer comprising recurring units derived from vinylidene fluoride (VDF) and trifluoroethylene (TrFE), said polymer comprising end groups of formula —$CF_2H$ and/or —$CF_2CH_3$ in an amount of at least 60 mmoles per kg of VDF recurring units [polymer (F)].

The Applicant has surprisingly found that when the VDF-TrFE polymer backbone is interrupted by short chain branches terminated by end groups of formula —$CF_2H$ and/or —$CF_2CH_3$, which typically originate from intra-chain transfer (back-biting) during radical polymerization as shown in scheme here below:

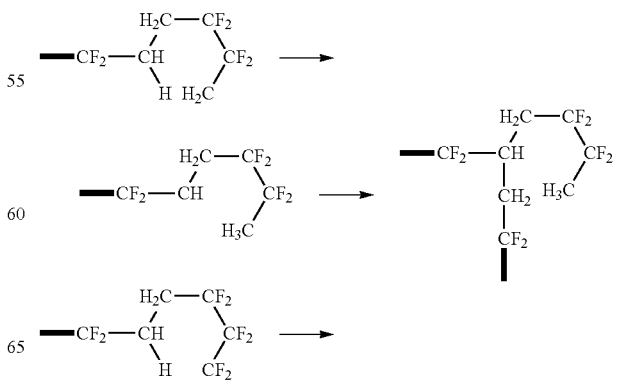

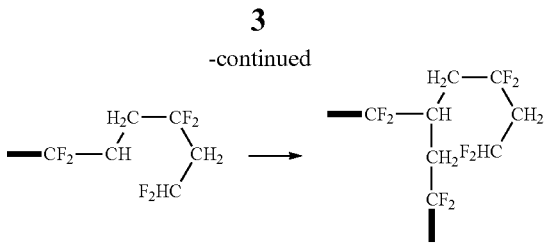

then the polymer advantageously exhibits a significantly improved flexibility and deformability while retaining typical ferro-, piezo-, pyro-electric and dielectric behaviour of polymers of the prior art, like, notably, unchanged piezoelectric coefficient.

Polymer (F) of the invention generally comprises 10 to 50% by moles preferably from 15 to 40% moles of recurring units derived from TrFE.

Polymer (F) of the invention may further comprise recurring units derived from one or more than one fluoromonomers other than VDF and TrFE, such as notably hexafluoropropylene (HFP), tetrafluoroethylene (TFE), chlorotrifluoroethylene (CTFE).

Nevertheless, polymer (F) consisting essentially of recurring units derived from VDF and TrFE is preferred according to a first embodiment of the invention.

Polymers (F) of the first embodiment of the invention typically consist essentially of:
from 10 to 50% by moles preferably from 15 to 40% moles of recurring units derived from TrFE; and
from 50 to 90% moles, preferably from 60 to 85% moles of recurring units derived from VDF.

According to a further embodiment of the invention, polymer (F) consists essentially of recurring units derived from VDF, TrFE and CTFE.

Polymers (F) of the second embodiment of the invention typically consist essentially of:
from 15 to 40% by moles, preferably from 20 to 35% moles, more preferably from 20 to 25% moles of recurring units derived from TrFE; and
from 55 to 76% moles, preferably from 62 to 74% moles, more preferably from 65 to 72% moles of recurring units derived from VDF; and
from 5 to 16% by moles, preferably from 6 to 12% moles, more preferably from 8 to 10% moles of recurring units derived from CTFE.

It is essential that the polymer (F) of the invention comprises at least 60 mmoles per kg of VDF recurring units of end groups of formula —$CF_2H$ and/or —$CF_2CH_3$ as above described, so as to exhibit required flexibility properties.

When the polymer (F) comprises less than 60 mmoles per kg of VDF recurring units of said end groups, its structure is stiff and brittle and the polymer is not endowed with adequate flexibility and deformability.

According to the first embodiment of the invention, polymer (F) comprises preferably at least 70 mmoles per kg of VDF recurring units, more preferably at least 80 mmoles per kg of VDF recurring units, even more preferably at least 90 mmoles per kg of VDF recurring units of end groups of formula —$CF_2H$ and/or —$CF_2CH_3$.

Melt flow index (MFI) of the polymer (F) will be selected by the skilled in the art in relation to the processing technology chosen for obtaining final parts (e.g. films or sheets).

It is nevertheless generally understood that polymer (F) will have a MFI determined according to ASTM D 1238 (230° C./5 kg) of advantageously 0.5 to 500 g/10 min, preferably of 1 to 200 g/10 min, more preferably of 2 to 10 g/10 min.

The invention also pertains to a process for the manufacture of the polymer (F) as above described.

The process of the invention advantageously comprises polymerizing VDF and TrFE and optionally one or more comonomer in an aqueous medium in the presence of a radical initiator and of a micro-emulsion of at least one perfluoropolyether oil having non-functional end groups and at least one fluorinated surfactant [surfactant (FS)].

The Applicant has also found that the micro-emulsion polymerization process is particularly suitable for manufacturing products of the invention, as it enables achieving suitable polymerization rate at limited trifluoroethylene (TrFE) partial pressure and overall pressure. As TrFE has been recognized to be endowed with deflagration/explosion behaviour similar to tetrafluoroethylene (TFE), opportunity of limiting polymerization pressure would represent a significant advantage in safety management.

Also, this reduced polymerization pressure enables substantial increase in above mentioned intra-chain transfer (back-biting) phenomena, so that the amount of end groups of formula —$CF_2H$ and/or —$CF_2CH_3$ is maximized, in particular at high polymerization temperatures.

Polymerization pressure is thus comprised between 15 and 35 bars, preferably between 18 and 35 bars, more preferably between 20 and 35 bars.

The skilled in the art will choose the polymerization temperature having regards, inter alia, of the radical initiator used. Polymerization temperature is generally selected in the range 80 to 120° C., preferably 95 to 120° C.

While the choice of the radical initiator is not particularly limited, it is understood that those suitable for the process according to the invention are selected among compounds capable of initiating and/or accelerating the polymerization.

Those skilled in this art will be familiar with a number of initiators that are suitable for the process of the invention.

Organic radical initiators can be used and include, but are not limited to, the following: acetylcyclohexanesulfonyl peroxide; diacetylperoxydicarbonate; dialkylperoxydicarbonates such as diethylperoxydicarbonate, dicyclohexylperoxydicarbonate, di-2-ethylhexylperoxydicarbonate; tert-butylperneodecanoate; 2,2'-azobis(4-methoxy-2,4dimethylvaleronitrile; tert-butylperpivalate; dioctanoylperoxide; dilauroyl-peroxide; 2,2'-azobis (2,4-dimethylvaleronitrile); tert-butylazo-2-cyanobutane; dibenzoylperoxide; tert-butyl-per-2ethylhexanoate; tert-butylpermaleate; 2,2'-azobis(isobutyronitrile); bis(tert-butylperoxy) cyclohexane; tert-butyl-peroxyisopropylcarbonate; tert-butylperacetate; 2,2'-bis (tert-butylperoxy)butane; dicumyl peroxide; di-tert-amyl peroxide; di-tert-butyl peroxide (DTBP); p-methane hydroperoxide; pinane hydroperoxide; cumene hydroperoxide; and tert-butyl hydroperoxide. Other suitable initiators include halogenated free radical initiators such as chlorocarbon based and fluorocarbon based acyl peroxides such as trichloroacetyl peroxide, bis(perfluoro-2-propoxy propionyl) peroxide, [$CF_3CF_2CF_2OCF(CF_3)COO$]$_2$, perfluoropropionyl peroxides, ($CF_3CF_2CF_2COO$)$_2$, ($CF_3CF_2COO$)$_2$, {($CF_3CF_2CF_2$)—[$CF(CF_3)CF_2O$]$_m$—$CF(CF_3)$—$COO$}$_2$ where m=0-8, [$ClCF_2(CF_2)_nCOO$]$_2$, and [$HCF_2(CF_2)_nCOO$]$_2$ where n=0-8; perfluoroalkyl azo compounds such as perfluoroazoisopropane, [($CF_3$)$_2$ $CFN$=]$_2$, $R°N$=$NR°$, where $R°$ is a linear or branched perfluorocarbon group having 1-8 carbons; stable or hindered perfluoroalkane radicals such as hexafluoropropylene trimer radical, [($CF_3$)$_2$$CF$]$_2$($CF_2CF_2$)$C°$ radical and perfluoroalkanes.

Redox systems, comprising at least two components forming a redox couple, such as dimethylaniline-benzoyl peroxide, diethylaniline-benzoyl peroxide and diphenylamine-benzoyl peroxide can also be used to initiate the polymerization.

Also, inorganic radical initiators can be used and include, but are not limited to, the followings: persulfates, like sodium, potassium or ammonium persulfates, permanganates, like potassium permanganate.

Organic radical initiators, as those above detailed, are preferred. Among them, the peroxides having a self-accelerating decomposition temperature (SADT) higher than 50° C. are particularly preferred, such as for instance: di-tert-butyl peroxide (DTBP), diterbutylperoxyisopropylcarbonate, terbutyl (2-ethyl-hexyl)peroxycarbonate, terbutylperoxy-3,5,5-trimethylhexanoate.

The radical initiator is included in a concentration ranging advantageously from 0.001 to 20 percent by weight of the polymerization medium.

Polymerization can be carried out in the presence of a chain transfer agent. The chain transfer agent is selected from those known in the polymerization of fluorinated monomers, such as for instance: ketones, esters, ethers or aliphatic alcohols having from 3 to 10 carbon atoms, such as acetone, ethylacetate, diethylether, methyl-ter-butyl ether, isopropyl alcohol, etc.; chloro(fluoro)carbons, optionally containing hydrogen, having from 1 to 6 carbon atoms, such as chloroform, trichlorofluoromethane; bis(alkyl)carbonates wherein the alkyl has from 1 to 5 carbon atoms, such as bis(ethyl)carbonate, bis(isobutyl)carbonate. The chain transfer agent can be fed to the polymerization medium at the beginning, continuously or in discrete amounts (step-wise) during the polymerization, continuous or stepwise feeding being preferred.

Micro-emulsion polymerization process as above detailed have been described in the past e.g. in U.S. Pat. No. 4,990,283 (AUSIMONT SPA (IT)) Feb. 5, 1991, U.S. Pat. No. 5,498,680 (AUSIMONT SPA) Mar. 12, 1996, U.S. Pat. No. 6,103,843 (AUSIMONT SPA) Aug. 15, 2000.

Non-functional end groups of PFPE oils are generally selected among fluoro(halo)alkyls having 1 to 3 carbon atoms, optionally comprising one or more halogen atoms different from fluorine or hydrogen atoms, e.g. $CF_3-$, $C_2F_5-$, $C_3F_6-$, $ClCF_2CF(CF_3)-$, $CF_3CFClCF_2-$, $ClCF_2CF_2-$, $ClCF_2-$.

The perfluoropolyether (PFPE) oils having non-functional end groups used in the process of the invention comprise as repeating units sequences of one or more oxyfluoroalkylenic units such as $-CF_2(CF_2)_zO-$, wherein z is an integer equal to 1, 2 or 3, $-CR_4R_5CF_2CF_2O-$ wherein $R_4$ and $R_5$ equal to or different from each other are chosen from H, Cl or perfluoroalkyl from 1 to 4 carbon atoms, $-CF_2CF(CF_3)O-$, $-CF(CF_3)CF_2O-$, $-CFYO-$, wherein Y is equal to F or $CF_3$.

Generally the PFPE oils have number average molecular weight comprised advantageously between 400 and 3000, preferably between 600 and 1500.

Preferred PFPE oils are those comprising as repeating units sequences of the following classes:

a) $(C_3F_6O)_{m'}(CFYO)_{n'}$ wherein the unit $(C_3F_6O)$ and (CFYO) are perfluorooxyalkylenic units statistically distributed along the chain; m'>0, n'≥0, and m'/n' being comprised between 5 and 40 for n' different from 0; Y is F or $CF_3$; said units being optionally bound among each other by a sequence of formula $-O-R'_f-O-$, wherein $R'_f$ is a divalent fluoroalkylenic group, e.g. a $C_1-C_4$ perfluoroalkylenic group;

b) $-(C_2F_4O)_{p'}(CFYO)_{q'}-(C_3F_6O)_{t'}-$
wherein p'>0, q'>0, t'≥0, and q'/q'+p'+t'≤1/10 and the t'/p' being from 0.2 to 6; Y=F or $CF_3$;

c) $CR_4R_5CF_2CF_2O$ wherein $R_4$ and $R_5$ are equal to or different from each other and chosen from F, H, Cl or perfluoroalkyl, said units being possibly bound each other as follows:

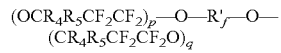

of formula $-O-R'_f-O-$, wherein $R'_f$ is a divalent fluoroalkylenic group, e.g. a $C_1-C_4$ perfluoroalkylenic group, p and q are integers from 0 to 200, and p+q is ≥1, d) $CF(CF_3)CF_2O$
said units being linked each other inside the fluoropolyoxyalkylenic chain as follows:

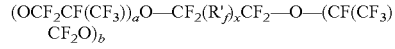

wherein $R'_f$ has the meaning indicated above, x is 0 or 1, a and b are integers and a+b is ≥1, e) $(C_2F_4O)_{a'}(CFYO)_{b'}$.
wherein a' and b' are integers>0, a'/b' ranges between 5 and 0.3, preferably between 2.7-0.5, Y is F or $CF_3$.

The preferred PFPE oils are those of general formula:

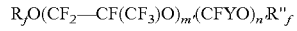

having a random distribution of the perfluorooxyalkylenic units, wherein $R_f$ and $R''_f$ equal to or different from each other, are fluoro(halo)alkyls having 1 to 3 carbon atoms, optionally comprising one or more halogen atoms different from fluorine or hydrogen atoms (e.g. $CF_3-$, $C_2F_5-$, $C_3F_6-$, $ClCF_2CF(CF_3)-$, $CF_3CFClCF_2-$, $ClCF_2CF_2-$, $ClCF_2-$), m' and n' are integers such that the number averaged molecular weight of the PFPE oil is comprised between 400 and 3000, preferably between 600 and 1500; and Y is F or $CF_3$.

The surfactant (FS) complies advantageously with formula:

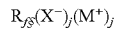

wherein $R_{fS}$ is a $C_5-C_{16}$ (per)fluoroalkyl chain optionally comprising one or more catenary or non-catenary oxygen atom(s), or a (per)fluoropolyoxyalkylene chain, $X^-$ is $-COO^-$, $-PO_3^-$ or $-SO_3^-$, $M^+$ is selected from $H^+$, $NH_4^+$, an alkaline metal ion and j can be 1 or 2.

As non limitative example of surfactants (FS), mention may be made of ammonium and/or sodium perfluorocarboxylates, and/or (per)fluoropolyoxyalkylenes having one or more carboxylic end groups.

More preferably, the fluorinated surfactant [surfactant (FS)] is chosen from:
- $CF_3(CF_2)_{n1}COOM'$, in which $n_1$ is an integer ranging from 4 to 10, preferably from 5 to 7, and more preferably being equal to 6; M' represents H, $NH_4$, Na, Li or K, preferably $NH_4$;
- $T-(C_3F_6O)_{n0}(CFXO)_{m0}CF_2COOM''$, in which T represents Cl or a perfluoroalkoxyde group of formula $C_kF_{2k+1}O$ with k is an integer from 1 to 3, a F atom being optionally substituted by a Cl atom; $n_0$ is an integer ranging from 1 to 6; $m_0$ is an integer ranging from 0 to 6; M" represents H, $NH_4$, Na, Li or K; X represents F or $CF_3$;
- $-F-(CF_2CF_2)_{n2}-CH_2-CH_2-RO_3M'''$, in which R is P or S, preferably S, M''' represents H, $NH_4$, Na, Li or K, preferably H; $n_2$ is an integer ranging from 2 to 5, preferably $n_2=3$;
- A-$R_{bf}$-B bifunctional fluorinated surfactants, in which A and B, equal to or different from each other, are $-(O)_p$CFX''—COOM*; M* representing H, $NH_4$, Na, Li or K, preferably M* representing $NH_4$; X''=F or $CF_3$; p is an integer equal to 0 or 1; $R_{bf}$ is a divalent perfluoroalkyl or (per)fluoropolyether chain such that the number average molecular weight of A-$R_{bf}$—B is in the range 300 to 1,800;

and mixtures thereof.

Preferred surfactants (FS) are those complying with formula $T(C_3F_6O)_{n0} (CFXO)_{m0}CF_2COOM''$ here above.

The invention also pertains to the use of polymer (F) as above described as ferroelectric, piezoelectric, dielectric or pyroelectric material in electric/electronic devices.

Non limitative examples of said devices are notably transducers, sensors, actuators, ferroelectric memories, capacitors.

The polymer (F) is generally comprised in said devices under the form of substantially bidimensional parts (e.g. films or sheets).

Said films or sheets can be manufactured according to standard techniques, as extrusion, injection moulding, compression moulding and solvent casting.

Said bidimensional articles can be further submitted to post-processing treatment, in particular for enhancing ferroelectric, piezoelectric, dielectric or pyroelectric behaviour, e.g. annealing, stretching, bi-orientation and the like.

Bidimensional articles can be notably submitted to an high poling electric field obtained by polarization cycles for adjusting, in real time via high voltage and data acquisition computer controlled system, polarization, residual polarization and maximum displacement current measured at the coercive field. An embodiment of this process is described in ISNER-BROM, P., et al. Intrinsic Piezoelectric Characterization of PVDF copolymers: determination of elastic constants. *Ferroelectrics*. 1995, vol. 171, p. 271-279, in BAUER, F., et al. Very high pressure behaviour of precisely-poled PVDF. *Ferroelectrics*. 1995, vol. 171, p. 95-102. and in U.S. Pat. No. 4,611,260 (DEUTSCH FRANZ FORSCH INST (FR)) Sep. 9, 1986 and U.S. Pat. No. 4,684,337 (DEUTSCH FRANZ FORSCH INST (FR)) Aug. 4, 1987, whose disclosures are incorporated herein by reference.

The invention will be now explained in more detail with reference to the following examples, whose purpose is merely illustrative and not intended to limit the scope of the invention.

Example 1

Manufacture of a VDF-TrFE Copolymer 75/25 (Molar Ratio)

In a 5 liter AISI 316 steel vertical autoclave equipped with baffles, and stirrer working at 550 rpm, 3.5 l of demineralized water were introduced. When temperature reached set-point of 120° C., 35 g of a sodium-based micro-emulsion as described in U.S. Pat. No. 7,122,608 (SOLVAY SOLEXIS SPA (IT)) Oct. 17, 2006 were introduced in the reactor together with 7.35 absolute bars of VDF. A gaseous mixture of VDF-TrFE (75/25% by moles) was then fed until reaching a pressure of 30 absolute Bars.

Gas phase, before starting polymerization, was shown by GC analysis to possess the following composition (in moles %): 82.5% VDF, 17.5% TrFE.

27 cc of pure di-tert-butyl peroxide (DTBP) were thus fed for initiating reaction. The polymerization pressure was maintained by continuously feeding above mentioned VDF-TrFE mixture. After feeding 2% of the targeted amount of mixture, the temperature was lowered to 105° C.; feeding was disrupted once 1150 g of the monomeric mixture were fed, and pressure was let falling down to 15 abs bars maintaining T=105° C. Reactor was then vented, cooled and latex discharged, coagulated by freezing, washed with demineralized water and dried at 100° C.

The copolymer obtained was found to possess a MFI (230° C./5 kg) of 3.5 g/10 min, a second melting temperature ($T_{m2}$ by DSC) of 144.5° C., a Curie temperature ($T_{curie2}$) of 109.6° C., and a crystallization temperature ($T_{xx}$) of 123.7° C. FIG. 1 depicts the DSC scan ($2^{nd}$ melting) of the polymer, wherein x-axis stands for temperature in ° C. and y-axis stands for normalized heat flow in W/g; the scan shows a first peak (A) associated to the Curie transaction (at 109.6° C.) and a second peak (B) related to polymer melting (at 144.5° C.). It is well known that above Curie temperature, a crystalline phase transaction takes place from a ferroelectric phase to a substantially paraelectric phase.

Other relevant properties of this copolymer are summarized in table 1 here below.

Chain ends were determined according to the method described in PIANCA, M., et al. End groups in fluoropolymers. *Journal of Fluorine Chemistry*. 1999, vol. 95, p. 71-84. Concentration of relevant end chains are expressed both as mmoles per kg of polymer and as mmoles per kg of VDF.

Example 2

Manufacture of a VDF-TrFE Copolymer 70/30 (Molar Ratio)

Same procedure of ex. 1 was repeated but using:

initial VDF pressure was 4.7 absolute Bars.

composition of the VDF/TrFE mixture was 70/30 mol/mol;

total amount of mixture fed was 1200 g.

Gas phase, before starting polymerization, was shown by GC analysis to possess the following composition (in moles %): 76.5% VDF, 23.5% TrFE.

The copolymer obtained was found to possess a MFI (230° C./5 kg) of 2.4 g/10 min, a second melting temperature ($T_{m2}$ by DSC) of 147.5° C., a Curie temperature ($T_{curie2}$) of 94.6° C., and a crystallization temperature ($T_{xx}$) of 125.1° C. Other relevant properties of this copolymer are summarized in table 1 here below.

Example 3

Manufacture of a VDF-TrFE Copolymer 75/25 (Molar Ratio)

Same procedure of ex. 1 was repeated but using:

30 cc of DTBP were fed instead of 27 cc;

1 cc of CFC A123 (chain transfer) was fed once 1% of monomer mixture was consumed.

Gas phase, before starting polymerization, was shown by GC analysis to possess the following composition (in moles %): 82.5% VDF, 17.5% TrFE.

The copolymer obtained was found to possess a MFI (230° C./5 kg) of 5.9 g/10 min, a second melting temperature ($T_{m2}$ by DSC) of 144.3° C., a Curie temperature ($T_{curie2}$) of 110° C., and a crystallization temperature ($T_{xx}$) of 122.7° C. Other relevant properties of this copolymer are summarized in table 1 here below.

Example 4

Manufacture of a VDF-TrFE Copolymer 75/25 (Molar Ratio)

Same procedure of ex. 1 was repeated but using:
24 cc of DTBP were fed instead of 27 cc.
Gas phase, before starting polymerization, was shown by GC analysis to possess the following composition (in moles %): 82.5% VDF, 17.5% TrFE.

The copolymer obtained was found to possess a MFI (230° C./5 kg) of 1.7 g/10 min, a second melting temperature ($T_{m2}$ by DSC) of 144.9° C., a Curie temperature ($T_{curie2}$) of 109.8° C., and a crystallization temperature ($T_{xx}$) of 122.8° C. Other relevant properties of this copolymer are summarized in table 1 here below.

Example 5

Manufacture of a VDF-TrFE Copolymer 83/17 (Molar Ratio)

Same procedure of ex. 1 was repeated but using:
32.5 ml of the microemulsion were initially introduced;
initial VDF pressure was 10.6 absolute Bars.
composition of the VDF/TrFE mixture was 83/17 mol/mol;
reaction was initiated with 30 ml of DTBP;
8 ml of CFC A 123 were fed once 1% of the mixture reacted;
total amount of mixture fed was 1150 g.
Gas phase, before starting polymerization, was shown by GC analysis to possess the following composition (in moles %): 89.5% VDF, 10.5% TrFE.

The copolymer obtained was found to possess a MFI (230° C./5 kg) of 29.2 g/10 min, a second melting temperature ($T_{m2}$ by DSC) of 138.6° C., a Curie temperature ($T_{curie2}$) of 138.6° C., and a crystallization temperature ($T_{xx}$) of 118.5° C. Other relevant properties of this copolymer are summarized in table 1 here below.

Comparative Example 6

Manufacture of a VDF-TrFE Copolymer 70/30 (Molar Ratio) by Suspension Polymerization In a 4 liters AISI 316 steel vertical autoclave equipped with a stirrer operating at 880 rpm, 1406 g of demineralized water were introduced. When temperature reached 14° C., 664 g of VDF, 358 g of TrFE were introduced in combination with 713 g of Ca(OH)$_2$ solution (40.25 DN/Kg), 26.5 g of a solution of Bermocoll® E230G (20 g/Kg), 3.11 g of ethyl chloroformate and 8.3 g of diethylenecarbonate. Temperature was then brought to 40° C. wherein a pressure of 80 absolute Bars was reached. Reaction was pursued until the pressure drop down to 44 Bars. Reactor was cooled at 55° C.; once pressure dropped to 29 Absolute Bars, temperature was brought to 60° C. Pressure was let drop to 8 absolute bars, reactor was cooled at room temperature, and discharged. A slurry containing 920 g of polymer was obtained, washed with demineralized water and dried at 100° C. for 16 hours.

The copolymer obtained was found to possess a MFI (230° C./5 kg) of 2.1 g/10 min, a second melting temperature ($T_{m2}$ by DSC) of 151.3° C., a Curie temperature ($T_{curie2}$) of 110.4° C., and a crystallization temperature ($T_{xx}$) of 139.1° C. Other relevant properties of this copolymer are summarized in table 1 here below.

Comparative Example 7

Manufacture of a VDF-TrFE Copolymer 75/25 (Molar Ratio) by Suspension Polymerization Same procedure of example 6 was repeated, but:
767 g of VDF and 255 g of TrFE were initially introduced.
A slurry containing 900 g of polymer was obtained, washed with demineralized water and dried at 100° C. for 16 hours.

The copolymer obtained was found to possess a MFI (230° C./5 kg) of 1.5 g/10 min, a second melting temperature ($T_{m2}$ by DSC) of 150° C., a Curie temperature ($T_{curie2}$) of 124.6° C., and a crystallization temperature ($T_{xx}$) of 128° C. Other relevant properties of this copolymer are summarized in table 1 here below.

Comparative Example 8

Manufacture of a VDF-TrFE Copolymer 75/25 (Molar Ratio) by Microemulsion Polymerization with Inorganic Initiator Similar procedure as described in example 1 was repeated but temperature was set at 80° C. before feeding 32.5 g of the microemulsion, 7.35 absolute bars of VDF and 33 ml of ethyl acetate. Mixture VDF-TrFE (75/25 mol/mol) was then fed until a total pressure of 50 absolute bars.

Gas phase, before starting polymerization, was shown by GC analysis to possess the following composition (in moles %): 82.5% VDF, 17.5% TrFE.

30 ml of a solution of ammonium peroxydisulfate (0.037 M) were fed for starting polymerization.

1150 g of the VDF-TrFE were continuously fed for maintaining pressure of 50 abs bar; then polymerization was interrupted and latex worked up as detailed in example 1.

The copolymer obtained was found to possess a MFI (230° C./5 kg) of 4.2 g/10 min, a second melting temperature ($T_{m2}$ by DSC) of 148° C., a Curie temperature ($T_{curie2}$) of 109.9° C., and a crystallization temperature ($T_{xx}$) of 123.9° C. Other relevant properties of this copolymer are summarized in table 1 here below.

TABLE 1

| Run | | Ex. 1 | Ex. 2 | Ex. 3 | Ex. 4 | Ex. 5 | Ex. 6C | Ex. 7C | Ex. 8C |
|---|---|---|---|---|---|---|---|---|---|
| VDF | % mol | 75.1 | 69.5 | 75.5 | 75.6 | 82.6 | 70.2 | 76.9 | 75.4 |
| TrFE | % mol | 24.9 | 30.5 | 24.5 | 24.4 | 174 | 29.8 | 23.1 | 24.6 |
| MFI | g/10' | 3.5 | 2.4 | 5.9 | 1.7 | 29.2 | 2.1 | 1.5 | 4.2 |
| Mn | /1000 | 128 | 136 | 120 | 143 | 106 | 164 | 196 | 125 |

TABLE 1-continued

| Run | Ex. 1 | Ex. 2 | Ex. 3 | Ex. 4 | Ex. 5 | Ex. 6C | Ex. 7C | Ex. 8C |
|---|---|---|---|---|---|---|---|---|
| Chain ends in mmol/kg of polymer | | | | | | | | |
| —$CF_2H$ (a) | 45 | 41 | 45 | 42 | 40 | 6 | 9 | 18 |
| —$CF_2CH_3$ (b) | 26 | 21 | 31 | 31 | 31 | 4 | 3 | 12 |
| total (a) + (b) | 71 | 62 | 76 | 73 | 71 | 10 | 12 | 30 |
| Chain ends in mmol/kg of VDF recurring units | | | | | | | | |
| Total (a) + (b) | 101 | 97 | 108 | 103 | 90 | 15 | 17 | 43 |

From comparison among number averaged molecular weight from GPC and number of chain ends of (a) and (b) types, it can be easily understood that these ends do not originate from polymer backbone ends, but rather from back biting and thus related to short chain branches in polymer backbone.

Example 9

Manufacture of a VDF-TrFE-CTFE Copolymer 71.4/21.6/7 (Molar Ratio)

Same procedure of ex. 1 was repeated but:
initial VDF pressure was 7 bar (abs) and initial pressure CTFE was 0.4 bar (abs).
composition of the continuously fed monomer mixture VDF/TrFE/CTFE was 71.4/21.6/7 mol/mol;
reaction was initiated with 20 ml of DTBP;
temperature was initially set at 120° C. and then maintained at 105° C., after having reacted 2% of the monomers.
Gas phase, before starting polymerization, was shown by GC analysis to possess the following composition (in moles %): 80.7% VDF, 11.8% TrFE, 7.5% CTFE.
587 g of the VDF-TrFE-CTFE monomer mixture were continuously fed for maintaining pressure of 30 abs bar; then polymerization was interrupted and latex worked up as detailed in example 1.
The copolymer obtained was found to possess a MFI (230° C./5 kg) of 2.9 g/10 min, a second melting temperature ($T_{m2}$ by DSC) of 122.1° C., a Curie temperature ($T_{curie2}$) of 44.6° C.

Example 10

Manufacture of a VDF-TrFE-CTFE Copolymer 70/23/7 (Molar Ratio)

Example 9 was repeated except that:
initial VDF pressure was 6.8 bar (abs);
a monomer mixture of VDF-TrFE-CTFE 70/23/7 was used for maintaining set point pressure.
Gas phase, before starting polymerization, was shown by GC analysis to possess the following composition (in moles %): 78.2% VDF, 13.6% TrFE, 8.2% CTFE.
The copolymer obtained was found to possess a MFI (230° C./5 kg) of 6.95 g/10 min, a second melting temperature ($T_{m2}$ by DSC) of 122° C., a Curie temperature ($T_{curie2}$) of 43.7° C.

Example 11

Manufacture of a VDF-TrFE-CTFE Copolymer 67/25/8 (Molar Ratio)

Example 9 was repeated except that:
initial VDF pressure was 6.45 bar (abs) and initial pressure CTFE was 0.45 bar (abs);
a monomer mixture of VDF-TrFE-CTFE 67/25/8 was used for maintaining set point pressure;
18 ml of DTBP were introduced for starting polymerization.
Gas phase, before starting polymerization, was shown by GC analysis to possess the following composition (in moles %): 74.9% VDF, 17.3% TrFE, 7.8% CTFE.
The copolymer obtained was found to possess a MFI (230° C./5 kg) of 4.4 g/10 min, a second melting temperature ($T_{m2}$ by DSC) of 118.7° C., a Curie temperature ($T_{curie2}$) of 26.6° C.

TABLE 2

| Run | | Ex. 9 | Ex. 10 | Ex. 11 |
|---|---|---|---|---|
| VDF | % mol | 70.6 | 71 | 66.4 |
| TrFE | % mol | 20.8 | 20.4 | 23.9 |
| CTFE | % mol | 8.6 | 8.6 | 9.7 |
| MFI | g/10' | 2.9 | 6.9 | 4.4 |
| Mn | /1000 | 113 | 113 | 117 |
| Chain ends in mmol/kg of polymer | | | | |
| —$CF_2H$ (a) | | 28 | 23 | 23 |
| —$CF_2CH_3$ (b) | | 13 | 16 | 15 |
| total (a) + (b) | | 41 | 39 | 38 |
| Chain ends in mmol/kg of VDF recurring units | | | | |
| Total (a) + (b) | | 66 | 62 | 66 |

Determination of Mechanical Properties

Copolymers Ex. 1, Ex.2, Ex.6C, Ex.8C, Ex. 9, Ex. 10 and Ex. 11 were pelletized in a twin screw extruder working with a temperature profile between 220 and 230° C.
Pellets were compression moulded into films having thickness of 300 µm; mechanical properties were evaluated on such films. Data are summarized in Table 3.

TABLE 3

| Polymer Sample | Modulus (MPa) | Yield stress (MPa) | elongation at yield | Stress at break (MPa) | Elongation at break |
|---|---|---|---|---|---|
| Ex. 1 | 900 | 27 | 12% | 50.4 | 450% |
| Ex. 2 | 730 | 23.5 | 13% | 49.5 | 525% |

TABLE 3-continued

| Polymer Sample | Modulus (MPa) | Yield stress (MPa) | elongation at yield | Stress at break (MPa) | Elongation at break |
|---|---|---|---|---|---|
| Ex. 9 | 151 | 9.5 | 14 | >23.5 | >936 |
| Ex. 10 | 170 | 10.3 | 12.3 | 24.4 | 1189 |
| Ex. 11 | 122 | 7.4 | 13 | >18.2 | >846 |
| Ex. 8C | 1059 | 24.7 | 7% | 44.1 | 230% |
| Ex. 6C | 1295 | 25.8 | 5% | 43.1 | 162% |

As it comes out from data of table 3, copolymers of the invention were found to be more flexible, as shown by the higher values of elongation at yield and at break of polymers of ex. 1 and 2, over corresponding polymers of comparative ex. 8 and 6.

Determination of Mechanical Properties on Polarized Films

Pellets as above described were dissolved in methylethylketone and films were formed by casting the solution on a glass substrate, followed by evaporation of the solvent. After drying for 14 hours at 100° C., films having a thickness about 30 μm were obtained. Films were then heated above the Curie temperature and quenched in air at room temperature. Annealing at 132-133° C. was pursued about one hour. Results of mechanical properties are summarized in table 4.

TABLE 4

| Polymer Sample | Modulus (MPa) | Yield stress (MPa) | Elongation at yield | Stress at break (MPa) | Elongation at break |
|---|---|---|---|---|---|
| Ex. 1 | 1650 | 40 | 6% | 39 | 42% |
| Ex. 2 | 1450 | 37 | 7% | 39 | 56% |
| Ex. 8C | 1630 | 39 | 5% | 35 | 16% |
| Ex. 6C | 1680 | 40 | 4% | 33 | 8% |

Determination of Piezoelectric Properties

Above mentioned annealed films were submitted to piezoelectric characterizations. Platinum and gold electrodes were sputtered on the surface. Polarization hysteresis measurements were carried out by means of a piezoelectric circuit.

Measurements on copolymers of Ex. 1, Ex.2, Control Ex.6 showed a residual polarization (polarization at zero voltage) higher than 5 μC/cm$^2$; electrical breakdown for these films 30 μm was found to be in the range of 300-400 V/μm. Both residual polarization and electrical breakdown were considered satisfactory for ferro-piezo-pyro electrical applications.

These data confirmed that copolymers of the invention, which, as already shown, possess improved flexibility and modified crystallization behaviour, are not negatively affected in their piezoelectric properties; in particular, these materials were found to have outstanding piezoelectric behaviour typical of VDF-TrFE copolymers, with substantially unmodified piezoelectric coefficients with respect to polymers of the prior art.

The invention claimed is:

1. A polymer comprising recurring units derived from vinylidene fluoride (VDF) and trifluoroethylene (TrFE), said polymer comprising end groups of formula —CF$_2$H and/or —CF$_2$CH$_3$ in a combined amount of at least 60 mmoles per kg of VDF recurring units [polymer (F)].

2. The polymer of claim 1, comprising 10 to 50% by moles of recurring units derived from TrFE.

3. The polymer of claim 2, consisting essentially of:
    from 10 to 50% by moles of recurring units derived from TrFE; and
    from 50 to 90% moles of recurring units derived from VDF.

4. The polymer of claim 2, consisting essentially of:
    from 15 to 40% by moles of recurring units derived from TrFE;
    from 55 to 76% moles of recurring units derived from VDF; and
    from 5 to 16% by moles of recurring units derived from chlorotrifluoroethylene (CTFE).

5. The polymer of claim 1, comprising at least 70 mmoles per kg of VDF recurring units of end groups of formula —CF$_2$H and/or —CF$_2$CH$_3$.

6. The polymer of claim 1, having a Melt Flow Index (MFI) determined according to ASTM D 1238 (230° C./5 kg) of from 0.5 to 500 g/10 min.

7. The polymer of claim 1, being in the form of substantially bidimensional parts.

8. An electric or electronic device in which the polymer (F) of claim 1 is used as ferroelectric, piezoelectric, dielectric or pyroelectric material.

9. The device according to claim 8, being selected from the group consisting of transducers, sensors, actuators, ferroelectric memories, and capacitors.

10. The device according to claim 8, wherein the polymer (F) comprised in said device is in the form of substantially bidimensional parts.

11. The device according to claim 10, wherein the substantially bidimensional parts are films or sheets.

* * * * *